United States Patent
Kim et al.

(10) Patent No.: US 11,508,935 B2
(45) Date of Patent: Nov. 22, 2022

(54) OLED PANEL FOR LIGHTING DEVICE WITH MOISTURE INTRUSION DELAY EFFECT

(71) Applicant: LG Display Co., Ltd., Seoul (KR)

(72) Inventors: Taeok Kim, Seoul (KR); Shin-Bok Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 315 days.

(21) Appl. No.: 16/209,344

(22) Filed: Dec. 4, 2018

(65) Prior Publication Data

US 2019/0189961 A1   Jun. 20, 2019

(30) Foreign Application Priority Data

Dec. 15, 2017   (KR) .................. 10-2017-0172831

(51) Int. Cl.
*H01L 51/52* (2006.01)
*H01L 27/32* (2006.01)

(52) U.S. Cl.
CPC ...... *H01L 51/5253* (2013.01); *H01L 27/3213* (2013.01); *H01L 27/3223* (2013.01); *H01L 51/5212* (2013.01); *H01L 51/5246* (2013.01); *H01L 2251/5361* (2013.01)

(58) Field of Classification Search
CPC ............. H01L 51/5253; H01L 27/3223; H01L 27/3213; H01L 51/5246; H01L 51/5268; H01L 51/5209; H01L 51/5225
See application file for complete search history.

(56) References Cited

U.S. PATENT DOCUMENTS

| | | | |
|---|---|---|---|
| 9,871,081 B2 * | 1/2018 | Kim | H01L 51/5253 |
| 2006/0087229 A1 | 4/2006 | Kim | |
| 2006/0158111 A1 | 7/2006 | Hayashi | |
| 2014/0070174 A1 * | 3/2014 | Kwon | H01L 51/5253 |
| | | | 438/34 |
| 2014/0159002 A1 * | 6/2014 | Lee | H01L 51/56 |
| | | | 438/34 |
| 2014/0210736 A1 * | 7/2014 | Jeon | G06F 3/0412 |
| | | | 345/173 |

(Continued)

FOREIGN PATENT DOCUMENTS

| CN | 102969456 A | 3/2013 |
|---|---|---|
| EP | 3 346 499 A1 | 7/2018 |

(Continued)

*Primary Examiner* — Sophia T Nguyen
*Assistant Examiner* — Scott E Bauman
(74) *Attorney, Agent, or Firm* — Seed IP Law Group LLP

(57) ABSTRACT

An organic light-emitting diode panel for a lighting device includes a substrate including an array area having an emission area and a dummy area disposed outside the array area, an auxiliary wiring pattern, a first electrode, a passivation pattern, an OLED emission structure, a second electrode, an adhesive layer, and an encapsulation layer. The passivation pattern and the adhesive layer have an uneven boundary surface therebetween in the dummy area. Alternatively, a lower surface of the adhesive layer has a 3D structure. Thus, a moisture intrusion path between the passivation pattern and the adhesive layer of the dummy area of the substrate may be increased. Thus, degradation of the OLED emission structure due to external moisture intrusion may be reduced or prevented.

10 Claims, 6 Drawing Sheets

(56) References Cited

U.S. PATENT DOCUMENTS

| | | | |
|---|---|---|---|
| 2014/0367651 A1 | 12/2014 | Song et al. | |
| 2015/0060786 A1 | 3/2015 | Kwak | |
| 2015/0097171 A1 | 4/2015 | Kim et al. | |
| 2016/0204373 A1* | 7/2016 | Park | H01L 27/3246 257/40 |
| 2016/0284770 A1 | 9/2016 | Kim | |
| 2016/0285038 A1* | 9/2016 | Kim | H01L 51/5237 |
| 2016/0351652 A1 | 12/2016 | Kim et al. | |
| 2017/0288004 A1* | 10/2017 | Kim | H01L 27/3276 |
| 2017/0288007 A1 | 10/2017 | Shin et al. | |
| 2017/0323936 A1 | 11/2017 | Lee et al. | |
| 2017/0331073 A1* | 11/2017 | Choi | H01L 27/3248 |
| 2018/0033998 A1* | 2/2018 | Kim | H01L 27/3246 |
| 2018/0095571 A1* | 4/2018 | Park | H01L 51/5203 |
| 2019/0179466 A1* | 6/2019 | Kim | G06F 3/0416 |
| 2019/0181373 A1* | 6/2019 | Kim | H01L 51/5225 |

FOREIGN PATENT DOCUMENTS

| | | |
|---|---|---|
| JP | 2016054144 A | 4/2016 |
| JP | 2017157406 A | 9/2017 |
| KR | 10-2013-0073057 A | 7/2013 |
| KR | 10-2017-0050538 A | 5/2017 |

\* cited by examiner

115a

OLED PANEL FOR LIGHTING DEVICE WITH MOISTURE INTRUSION DELAY EFFECT

CROSS-REFERENCE TO RELATED APPLICATION

This application claims priority under 35 U.S.C. § 119 to Korean Application No. 10-2017-0172831, filed on Dec. 15, 2017, whose entire disclosure is herein incorporated by reference.

BACKGROUND

Technical Field

The present disclosure relates to a light-emitting panel for a lighting device, and more particularly, to an organic light-emitting diode (OLED) panel having an excellent moisture intrusion delay effect and excellent life characteristics.

Description of the Related Art

Fluorescent lamps or incandescent lamps are mainly used as lighting devices. For incandescent lamps, a color rendering index is high, but energy efficiency is very low. For fluorescent lamps, while energy efficiency is high, a color rendering index is low. Furthermore, since a fluorescent lamp contains mercury, an environmental problem occurs.

Recently, light-emitting diode (LED) based lighting devices have been suggested. LEDs are formed in a stack structure of a nitride semiconductor such as GaN. LEDs have the highest emission efficiency in a blue wavelength range, and the emission efficiency gradually decreases toward a red wavelength range and a green wavelength range having the maximum luminous efficacy. Accordingly, when a white light is emitted by combining a red emission diode, a green emission diode, and a blue emission diode, the emission efficiency may deteriorate. Furthermore, when a red emission diode, a green emission diode, and a blue emission diode are in use, color rendering characteristics may deteriorate because the width of an emission peak of each diode is narrow.

To solve the above problem, instead of combining a red emission diode, a green emission diode, and a blue emission diode, a lighting device that outputs a white light by combining a blue emission diode and yellow phosphor has been suggested. The lighting device configured as above has been suggested because it is more efficient to use only the blue emission diode having relatively high emission efficiency, instead of using the green emission diode having relatively low emission efficiency, and to use, for the other colors, a phosphor substance emitting a yellow light by receiving a blue light.

However, in the lighting device that outputs a white light by combining a blue emission diode and a yellow phosphor, the phosphor substance for emitting a yellow light has poor emission efficiency. Thus, there has been a limitation in improving the emission efficiency of a lighting device.

In particular, in the case of a nitride semiconductor LED based lighting device, a heat dissipation device is disposed on a rear surface of a lighting device due to a lot of heat generated from a light-emitting diode. Furthermore, for high-quality growth of nitride semiconductor, an expensive sapphire substrate is used.

Furthermore, in the case of a nitride semiconductor light-emitting diode based lighting device, there are many processes including an epitaxy growth for growing nitride semiconductor, a chip process for manufacturing individual light-emitting diode chips, and a mounting process for mounting individual light-emitting diode chips on a circuit board.

To solve the above problems of the nitride semiconductor light-emitting diode based lighting device, much research has been conducted on organic light-emitting diode (OLED) based lighting devices.

Since organic light-emitting diodes can be made in a large area, surface emission is available. Also, an expensive sapphire substrate for forming a nitride semiconductor light-emitting diode is not necessary. Furthermore, not much heat is generated compared to the nitride semiconductor light-emitting diode.

However, in an OLED based lighting device, an OLED is vulnerable to moisture. In the OLED, intrusion of moisture occurs in a dummy area at an edge side of a substrate, mostly through a boundary surface between a passivation pattern and an adhesive layer for forming an encapsulation layer. As the intrusion of moisture continues in the OLED, the OLED may deteriorate and light emission performance may be degraded. Accordingly, the life characteristics of a lighting device may deteriorate.

BRIEF SUMMARY

An embodiment of the present disclosure provides an organic light-emitting diode (OLED) panel.

Another embodiment of the present disclosure provides an OLED panel which may prevent deterioration of an OLED light-emitting structure due to intrusion of moisture by increasing a moisture intrusion path.

The present disclosure is not limited to the above-described embodiments, and other embodiments and advantages can be appreciated by those skilled in the art from the following descriptions.

In accordance with a first aspect of the present disclosure, an OLED panel for a lighting device according to an embodiment includes an array area having an emission area and a dummy area disposed outside the array area, and comprises a substrate, an auxiliary wiring pattern, a first electrode, a passivation pattern, an OLED emission structure, a second electrode, and an adhesive layer.

The auxiliary wiring pattern may be disposed on the substrate. The first electrode may be disposed on the substrate where the auxiliary wiring pattern is disposed. The passivation pattern may be disposed on the substrate where the first electrode is disposed, and may surround the auxiliary wiring pattern and the first electrode in the dummy area. The OLED emission structure may be disposed on the substrate where the passivation pattern is disposed in the array area. The second electrode may be disposed on the substrate where the OLED emission structure is disposed. The adhesive layer may be disposed on the substrate where the second electrode is disposed and may contact the passivation pattern in the dummy area. An optional encapsulation layer may be disposed on the adhesive layer.

In an OLED panel for a lighting device according to the present disclosure, the passivation pattern and the adhesive layer may have an uneven boundary surface therebetween in the dummy area. The uneven boundary surface between the passivation pattern and the adhesive layer in the dummy area increases a path along which moisture intrudes, and thus degradation of the OLED emission structure due to external moisture intrusion may be prevented. Furthermore, the uneven boundary surface between the passivation pattern and the adhesive layer in the dummy area may act as a barrier to the moisture intrusion. Accordingly, the uneven boundary surface between the passivation pattern and the adhesive layer in the dummy area may improve life characteristics of the OLED panel.

Also, one or more dummy structure patterns may be arranged in the dummy area of the substrate, and the passivation pattern in the dummy area may have an uneven surface corresponding to the surface of the substrate where the dummy structure pattern is arranged. When the dummy structure pattern is arranged in the dummy area of the substrate, the auxiliary wiring pattern, the first electrode, and the passivation pattern, which are provided thereon in a deposition method, may also have an uneven surface corresponding to the surface of the substrate where the dummy structure pattern is arranged. As a result, an uneven surface boundary may be formed between the passivation pattern and the adhesive layer in the dummy area.

The dummy structure pattern to form the uneven surface boundary between the passivation pattern and the adhesive layer in the dummy area may include a light extraction material. To increase light extraction efficiency of a lighting device, a light extraction pattern may be generally arranged in the array area on the substrate. The light extraction pattern may be formed by inkjet coating. When the light extraction pattern is also arranged in the dummy area on the substrate, the dummy structure pattern including the light extraction material may be formed.

In another example, the dummy structure pattern to form the uneven surface boundary between the passivation pattern and the adhesive layer in the dummy area may include the same material as the auxiliary wiring pattern. The auxiliary wiring pattern may be arranged in the entire area of the substrate except an emission area by depositing metal in the entire area of the substrate except a part of a pad area, and etching the emission area. Alternatively, the auxiliary wiring pattern may be arranged in the entire area of the substrate except an emission area by depositing metal in the entire area of the substrate and etching the emission area. Alternatively, the auxiliary wiring pattern may be arranged in the entire area of the substrate except an emission area and a part of a pad area by depositing metal in the entire area of the substrate except a part of the pad area, and etching the emission area. Alternatively, metal may be deposited in the entire area of the substrate, and a part of the pad area and the emission area of the array area is etched and thus the auxiliary wiring pattern may be arranged in the entire area, except the etched areas. In this state, when etching is performed on a part of the auxiliary wiring pattern in the dummy area, the dummy structure pattern may be formed.

Furthermore, the capping layer formed of an organic material and/or an inorganic material may be further provided on the second electrode. As the capping layer is provided on the second electrode, the intrusion of moisture into the OLED emission structure from above may be effectively prevented, and the light generated from the OLED emission structure may be effectively extracted.

In accordance with a second aspect of the present disclosure, an OLED panel for a lighting device according to another embodiment, like the above-described embodiment, includes the auxiliary wiring pattern, the first electrode, the passivation pattern, the OLED emission structure, the second electrode, the adhesive layer, and the encapsulation layer, which are sequentially disposed on the substrate. In the present embodiment, a lower surface of the adhesive layer in the dummy area may have a three-dimensional (3D) structure. Preferably, one or more grooves penetrating through the passivation pattern arranged in the dummy area of the substrate may be provided, and a part of the adhesive layer may be provided in the groove.

Through the groove penetrating through the passivation pattern arranged in the dummy area of the substrate, the lower surface of the adhesive layer in the dummy area may have a 3D structure. Accordingly, the path along which moisture intrudes may be increased, and thus degradation of the OLED emission structure due to external moisture intrusion may be prevented. Furthermore, the passivation pattern between the grooves may act as a barrier to the moisture intrusion.

Preferably, the groove may further penetrate through the first electrode and the auxiliary wiring pattern arranged under the passivation pattern in the dummy area of the substrate. Furthermore, the side wall of the groove may have a step shape. Since the height and the step-shaped structure of the groove may further increase the path of the moisture intrusion, high moisture intrusion delay effect may be obtained.

In accordance with a third aspect of the present disclosure, similar to the above-described embodiment of the first aspect, an OLED panel for a lighting device according to another embodiment, which includes an array area having an emission area and a pad area disposed near the array area, comprising the auxiliary wiring pattern, the first electrode, the passivation pattern, the OLED emission structure, the second electrode, and the optional adhesive layer and the optional encapsulation layer, which are sequentially disposed on the substrate. In the present embodiment, a pad including the same material as the auxiliary wiring pattern is disposed on the substrate in the pad area and contacts the passivation pattern, and the passivation pattern and the pad have an uneven boundary surface therebetween.

The uneven boundary surface between the passivation pattern and the pad increases a path along which moisture intrudes, and thus degradation of the OLED emission structure due to external moisture intrusion may be prevented. Furthermore, the uneven boundary surface between the passivation pattern and the pad may act as a barrier to the moisture intrusion. Accordingly, the uneven boundary surface between the passivation pattern and the pad may improve life characteristics of the OLED panel.

DETAILED DESCRIPTION

Hereinafter, an OLED panel for a lighting device according to embodiments of the present disclosure, and a manufacturing method thereof, will be described in detail with reference to the accompanying drawings.

Terms such as "first" and "second" are used herein merely to describe a variety of constituent elements, but the constituent elements are not limited by the terms. Such terms are used only for the purpose of distinguishing one constituent element from another constituent element.

Furthermore, in the present disclosure, when a constituent element is disposed "above" or "on" to another constituent element, the constituent element may be not only directly on the other constituent element, but also above the other constituent element in a non-contact manner through at least one of other constituent elements, e.g., a third constituent element.

Figure 1:
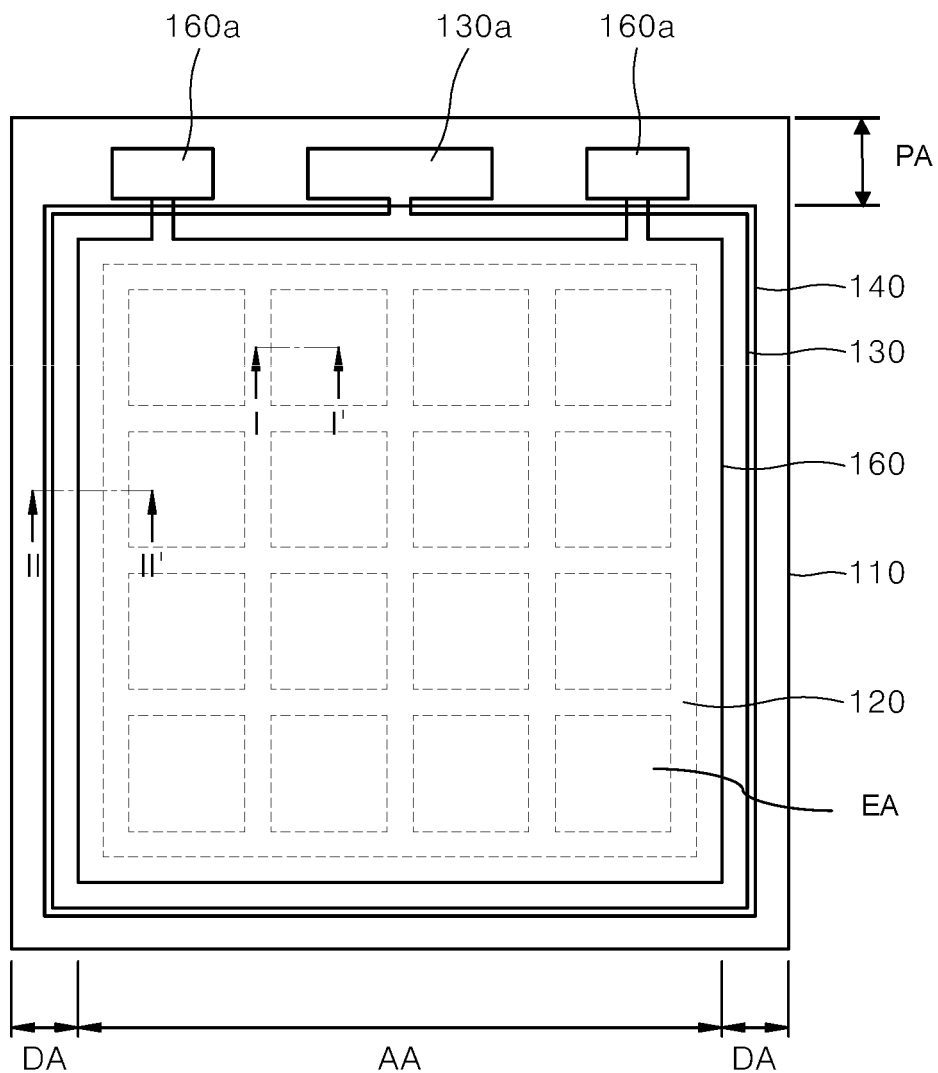
FIG. 1 is a schematic plan view of an OLED panel for a lighting device according to an embodiment of the present disclosure.
Figure 2:
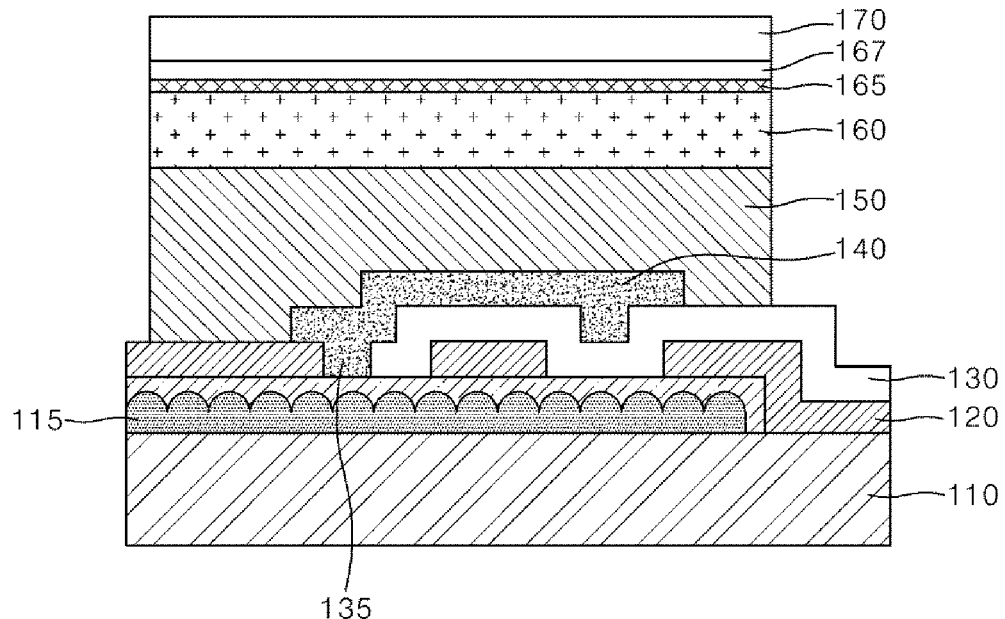
FIG. 2 is a cross-sectional view taken along line I-I' of FIG. 1
Figure 3:
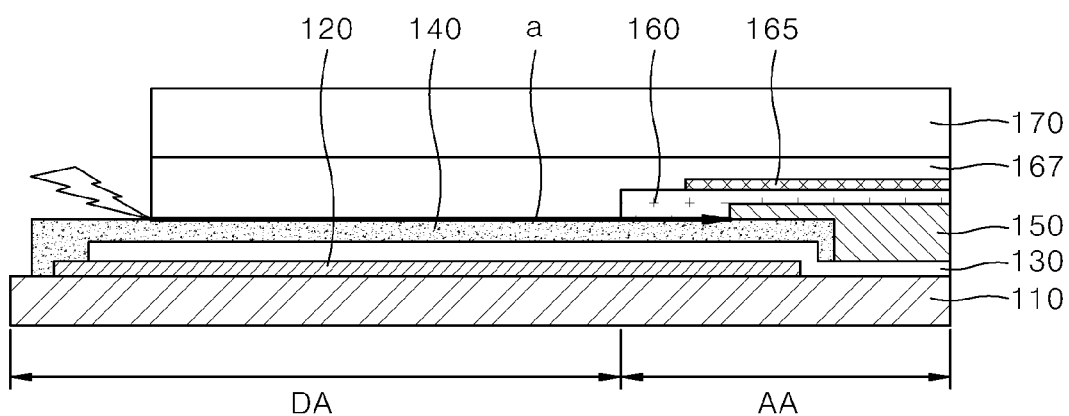
FIG. 3 is an example of a cross-sectional view taken along line II-II' of FIG. 1.

FIG. 1 is a schematic plan view of an OLED panel for a lighting device according to an embodiment of the present disclosure. FIG. 2 is a cross-sectional view taken along line I-I' of FIG. 1, showing an array area. FIG. 3 is an example of a cross-sectional view taken along line II-II' of FIG. 1, showing a dummy area.

Referring to FIGS. 1 to 3, the OLED panel for a lighting device according to the present disclosure may include a substrate 110, an auxiliary wiring pattern 120 (indicated by dotted lines in FIG. 1), a first electrode 130, a passivation pattern 140, an OLED emission structure 150 (not shown in FIG. 1), a second electrode 160, an adhesive layer 167 (not shown in FIG. 1), and an encapsulation layer 170 (not shown in FIG. 1).

The substrate 110 may be a glass substrate. Furthermore, the substrate 110 may be formed of a polymer material such as polyimide (PI), poly(ethylene naphthalate) (PEN), or poly(ethylene terephthalate) (PET) to exhibit flexibility characteristics. When the substrate 110 is formed of a polymer material, a flexible OLED panel for a lighting device may be manufactured by a roll-to-roll process.

Referring to FIGS. 1 and 3, the substrate 110 may include an array area AA and a dummy area DA outside the array area AA. Although in FIGS. 1 and 3 the array area AA and the dummy area DA are divided with respect to the second electrode 160, this is a mere example and the present disclosure is not limited thereto. For example, the array area AA and the dummy area DA may be divided with respect to the OLED emission structure 150.

As shown in FIG. 1, the array area AA may include one or more emission areas EA in which the OLED emission structure 150 (see FIG. 3) emits light. The emission area may be defined to be an area in the array area AA in which a lower surface of the OLED emission structure 150 contacts the first electrode 130, for example, an anode electrode, and an upper surface of the OLED emission structure 150 contacts the second electrode 160, for example, a cathode electrode.

Although not illustrated, a barrier layer may be provided on an upper surface of the substrate 110. The barrier layer may restrict a reaction between the substrate 110 and the auxiliary wiring pattern 120 and a reaction between the substrate 110 and the first electrode 130. The barrier layer may include an inorganic material such as $SiO_2$ or $SiN_x$, but the present disclosure is not limited thereto.

Furthermore, referring to FIG. 2, a light extraction pattern 115 may be disposed on the substrate 110, for example, between the substrate 110 and the auxiliary wiring pattern 120, in the array area AA. The light extraction pattern 115 may include a light extraction material. The light extraction material may be light scattering particles having high refraction indexes such as $TiO_2$, $BaTiO_3$, $ZrO_2$, ZnO, or $SiO_2$. The light extraction pattern 115 may be in the form of a film, and preferably an inkjet print pattern. The light extraction pattern 115 may contribute to obtaining light extraction efficiency.

The auxiliary wiring pattern 120 is disposed on the substrate 110. The auxiliary wiring pattern 120 functions as follows. The first electrode 130 may be generally formed of a transparent conductive oxide (TCO) material such as indium tin oxide (ITO) or fluorine-doped tin oxide (FTO). The transparent conductive oxide material may have a merit of transmitting the light emitted from the OLED emission structure 150 and also have a demerit of having very high electrical resistance compared to metal. Accordingly, when a large sized OLED panel for a lighting device is manufactured, a distribution of applied voltages is irregular across the overall first electrode due to high resistance of a transparent conductive oxide. Such irregular voltage distribution may deteriorate luminance uniformity of a large sized lighting device.

Accordingly, the auxiliary wiring pattern 120 is formed of a material having resistance lower than that of the transparent conductive oxide which is used to make the first electrode 130, for example, metal such as Cu or Al. Thus, the auxiliary wiring pattern 120 functions to allow the distribution of a voltage applied to the first electrode 130 that is provided in contact with the auxiliary wiring pattern 120 to be entirely uniform over the first electrode 130.

Although the auxiliary wiring pattern 120 may have a net shape as illustrated in FIG. 1, the present disclosure is not limited thereto. Furthermore, although the auxiliary wiring pattern 120 may have a shape close to a left to right symmetry, the present disclosure is not limited thereto. Furthermore, although in FIG. 2 the auxiliary wiring pattern 120 has an end having a vertical shape forming a rectangular cross-section, the end of the auxiliary wiring pattern 120 may have an inclined shape, and a tapered sectional shape in this case.

The first electrode 130 is disposed on the substrate 110 on which the auxiliary wiring pattern 120 is disposed. The first electrode 130 is connected to a first electrode pad 130a as illustrated in FIG. 1. The first electrode 130 may be formed of a transparent conductive oxide material such as ITO, and may be formed by sputtering process or coating process.

The auxiliary wiring pattern 120 may include a metal material, and the first electrode 130 may include a transparent conductive oxide material. To have light extraction in a downward direction or both of upward and downward directions, the first electrode 130 may include a transparent conductive oxide material. As described above, the auxiliary wiring pattern 120 may compensate for the high resistance of a transparent conductive oxide, contributing to application of an overall uniform voltage to the first electrode 130.

The first electrode 130 may be an anode electrode, and the second electrode 160 described later may be a cathode electrode. Reversely, while the first electrode 130 may be a cathode electrode, the second electrode 160 may be an anode electrode.

The passivation pattern 140 is disposed on the first electrode 130. The passivation pattern 140 may be disposed in an area where the auxiliary wiring pattern 120 is disposed. Furthermore, the passivation pattern 140, as illustrated in FIG. 3, may have a shape surrounding the auxiliary wiring pattern 120 and the first electrode 130 in the dummy area DA.

When, in OLED lighting, a short circuit is generated between the first electrode 130 and the second electrode 160 due to moisture intrusion, luminance degradation may occur not only in a shorted portion but also in an entire panel due to current drop. To prevent the above, the passivation pattern 140 is formed at least in an area where at least the auxiliary wiring pattern 120 is disposed.

The passivation pattern 140 may be formed of an organic material such as polyimide based material, or an inorganic material such as alumina ($Al_2O_3$) or silicon nitride ($SiN_x$). A passivation material may be deposited by an atomic layer deposition (ALD) method or a chemical vapor deposition (CVD) method.

Furthermore, as illustrated in FIG. 2, an opening 135 for exposing the substrate 110 may be disposed in the first electrode 130. The passivation pattern 140 is additionally provided in the opening 135. As the passivation pattern 140 is additionally provided in the opening 135, intrusion of moisture or air into the OLED emission structure may be effectively restricted.

The OLED emission structure 150 is disposed in the array area AA on the substrate 110 where the passivation pattern 140 is disposed. Referring to FIGS. 2 and 3, one part of the lower surface of the OLED emission structure 150 contacts the passivation pattern 140, and the other part thereof contacts the first electrode 130. The portion where the OLED emission structure 150 and the passivation pattern 140 contact each other may be a non-emission area, and a portion where the OLED emission structure 150 and the first electrode 130 contact each other may be an emission area.

The OLED emission structure 150 may include an organic emission layer (EML), a hole injection layer (HIL) and/or a hole transport layer (HTL) for providing holes to the organic emission layer, and an electron transport layer (ETL) and/or an electron injection layer (EIL) for providing electrons to the organic emission layer.

Each layer of the OLED emission structure 150 may be formed by depositing an organic material, for example, copperphthalocyanine (CuPc), N,N'-Di(naphthalene-1-yl)-N,N'-diphenylbenzidine (NPB), or tris-8-hydroxyquinoline aluminum (Alq3), in a vacuum deposition method.

The second electrode 160 is disposed on the substrate 110 where the OLED emission structure 150 is disposed. Referring to FIGS. 1 and 3, in the OLED panel for a lighting device according to the present disclosure, the second electrode 160 is disposed in the array area AA. The second electrode 160 is connected to each of second electrode pads 160a, as illustrated in FIG. 1. The second electrode 160 may be formed of a transparent conductive oxide material such as ITO, or a metal material.

Referring to FIGS. 2 and 3, a capping layer 165 may be disposed on the second electrode 160. As the capping layer 165 is disposed on the second electrode 160, intrusion of moisture into the OLED emission structure 150 from the above may be effectively prevented. Furthermore, in the case of a double-sided emission type, the capping layer 165 may contribute to effective extraction of light generated from the OLED emission structure in an upward direction. The capping layer 165 may include one or more inorganic materials such as $SiO_2$, $SiN_x$, $MgF_2$, ZnO, $TiO_2$, $ZrO_2$, NiO, or one or more organic materials such as GaN, or acryl, polyimide, polyamide, poly(3,4-ethylenedioxythiophene) (PEDOT), or include a mixture of the inorganic material and the organic material. Furthermore, the capping layer 165 may have a monolayer structure or a multilayer structure of at least two layers.

The adhesive layer 167 is provided to arrange the encapsulation layer 170, and is disposed on the substrate 110 where the second electrode 160 is disposed. An upper surface of the adhesive layer 167 may be planarized.

The encapsulation layer 170 is disposed on the adhesive layer 167 and prevents intrusion of external moisture or air. The encapsulation layer 170 may be formed of an organic material such as an acrylate based compound or an epoxy based compound, an inorganic material such as ceramic or metal, or an organic/inorganic composite material, and may be in the form of a film having a monolayer structure or a multilayer structure.

A protection film may be disposed on the encapsulation layer 170 via an additional adhesive layer. The protection film may prevent the intrusion of external moisture or air. The protection film may be a PET substrate or metal foil.

Referring to FIG. 1, the first electrode pad 130a is disposed in a pad area PA and connected to the first electrode 130. Each of the second electrode pads 160a is connected to the second electrode 160. In FIG. 1, the first electrode pad 130a is disposed in a center portion of the pad area PA, and the second electrode pads 160a are disposed at both sides of the first electrode pad 130a. However, the arrangement, size, or number of the electrode pads may vary as necessary.

The first electrode pad 130a may include a lower layer of the same material as the auxiliary wiring pattern 120 and an optional upper layer of the same material as the first electrode 130. The lower layer may be simultaneously formed with the auxiliary wiring pattern 120, and may be directly connected to the auxiliary wiring pattern 120. The optional upper layer may be simultaneously formed with the first electrode 130. When the lower layer is directly connected to the auxiliary wiring pattern 120, the upper layer does not need to be directly connected to the first electrode 130.

Furthermore, the second electrode pad 160a may include a lower layer of the same material as the auxiliary wiring pattern 120 and an optional upper layer of the same material as the second electrode 160. While the lower layer may be simultaneously formed with the auxiliary wiring pattern 120, the upper layer may be simultaneously formed with the second electrode 160.

Referring to FIG. 3, it may be seen that, in the dummy area DA, a boundary surface between the adhesive layer 167 and the passivation pattern 140 may be flat. The intrusion of external moisture into the OLED emission structure is mainly carried out along the boundary surface between the adhesive layer 167 and the passivation pattern 140. When the moisture intrusion continues, contraction of cells of the OLED emission structure 150 may be generated and thus the life of an OLED panel may be shortened. Accordingly, the moisture intrusion needs to be delayed by increasing a moisture intrusion path to OLED emission structure.

When the boundary surface between the adhesive layer 167 and the passivation pattern 140 is flat as illustrated in FIG. 3, the moisture intrusion may be delayed by increasing the width of the dummy area DA. However, increasing the width of the dummy area DA causes a decrease in the size of the array area AA. As a result, the size of an emission area is decreased.

Figure 4:
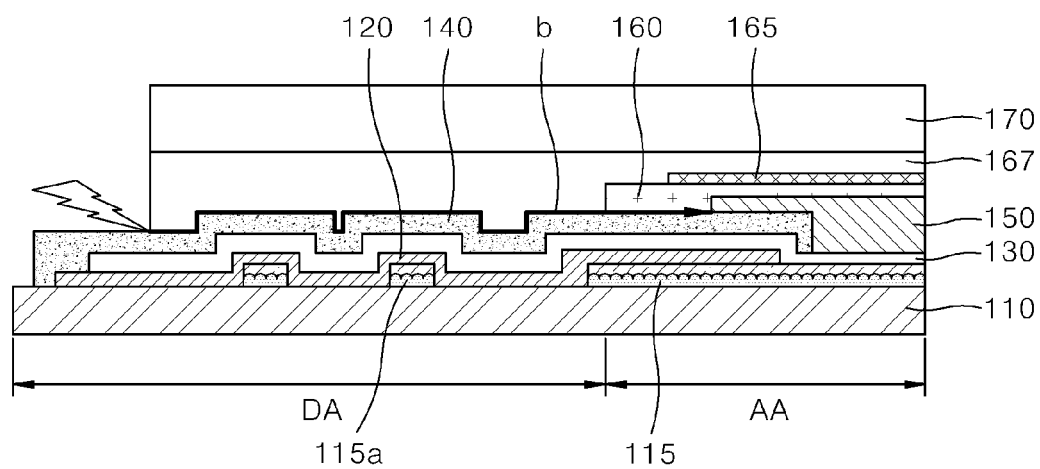
FIG. 4 is another example of a cross-sectional view taken along line II-II' of FIG. 1.

FIG. 4 is another example of a cross-sectional view taken along line II-II' of FIG. 1.

Referring to FIG. 4, it may be seen that, in the dummy area DA, the passivation pattern 140 and the adhesive layer 167 contact each other. In particular, in the dummy area DA, the passivation pattern 140 and the adhesive layer 167 have an uneven boundary surface corresponding to a three-dimensional (3D) structure.

In the dummy area DA, compared to a moisture intrusion path (arrow a of FIG. 3) when the passivation pattern 140 and the adhesive layer 167 have a flat boundary surface corresponding to a two-dimensional (2D) structure, a moisture intrusion path (arrow b of FIG. 4) when the passivation pattern 140 and the adhesive layer 167 have an uneven boundary surface is relatively increased. In the dummy area DA, the external moisture intrusion into the OLED emission structure 150 may be delayed through the uneven boundary surface between the passivation pattern 140 and the adhesive layer 167. Accordingly, the emission characteristics degradation of the OLED emission structure 150 due to the external moisture intrusion may be prevented. As a result, the life characteristics of the OLED panel for a lighting device may be improved.

In the structure of FIG. 4, at least one dummy structure pattern 115a is disposed in the dummy area DA of the substrate 110. Accordingly, a surface of the substrate 110 where the dummy structure pattern 115a is disposed has an uneven structure. Accordingly, the passivation pattern 140 in the dummy area DA formed by deposition may have an uneven surface corresponding to the surface of the substrate 110 where the dummy structure pattern 115a is disposed. In other words, when the dummy structure pattern 115a is provided in the dummy area DA of the substrate 110, the auxiliary wiring pattern 120, the first electrode 130, and the passivation pattern 140 that are provided thereon by a deposition method may also have uneven surface corresponding to the surface of the substrate 110 where the dummy structure pattern 115a is disposed. Accordingly, in the dummy area DA, the uneven boundary surface between the passivation pattern 140 and the adhesive layer 167 may be formed.

Referring to FIG. 4, in the dummy area DA, the dummy structure pattern 115a to form the uneven boundary surface between the passivation pattern 140 and the adhesive layer 167 may be a light extraction pattern including a light extraction material. When the light extraction pattern 115 is formed in the array area AA by an inkjet coating method to improve the light extraction efficiency, the light extraction pattern 115 is further formed in the dummy area DA. The light extraction pattern 115 formed in the dummy area DA may become the dummy structure pattern 115a for forming the uneven boundary surface between the passivation pattern 140 and the adhesive layer 167.

Figure 5:
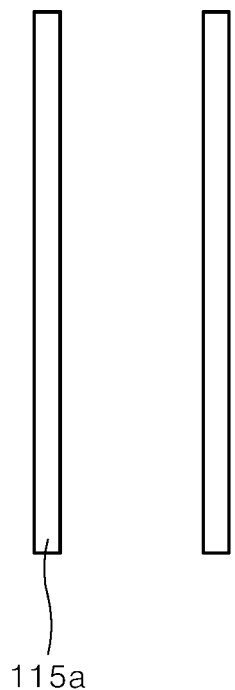
FIG. 5 is a schematic plan view illustrating an example of a dummy structure pattern.
Figure 6:
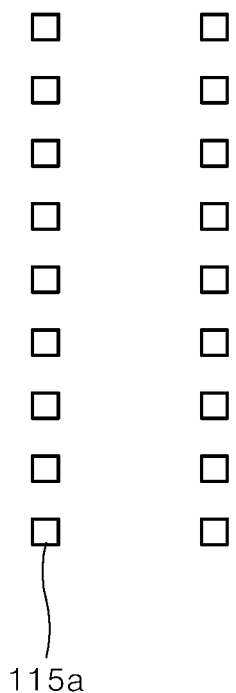
FIG. 6 is a schematic plan view illustrating another example of a dummy structure pattern.

FIGS. 5 and 6 are schematic plan views illustrating examples of the dummy structure pattern 115a. The dummy structure pattern 115a, as illustrated in FIG. 5, may be arranged in the form of lines. Furthermore, the dummy structure pattern 115a, as illustrated in FIG. 6, may be arranged in the form of dots.

Figure 7:
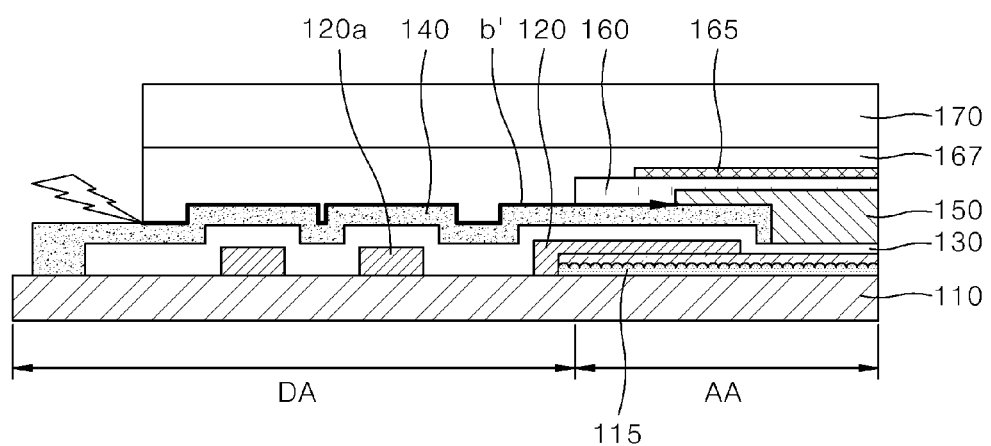
FIG. 7 is another example of a cross-sectional view taken along line II-II' of FIG. 1.

FIG. 7 is another example of a cross-sectional view taken along line II-II' of FIG. 1.

FIG. 7 illustrates a dummy structure pattern 120a in another shape. The dummy structure pattern 120a of FIG. 7 may include the same material as the auxiliary wiring pattern 120, and may be formed simultaneously with the auxiliary wiring pattern 120. In the case of the auxiliary wiring pattern 120, metal is deposited in the entire area of the substrate 110, and a part of the pad area such as the second electrode pads 160a and the emission area of the array area AA, is etched and thus the auxiliary wiring pattern 120 may be arranged in the entire area, except the etched areas. Alternatively, the auxiliary wiring pattern 120 may be arranged in the entire area of the substrate 110 except the emission area of the array area AA and the pad area by depositing metal in the entire area of the substrate 110 except a part of the pad area, and etching the emission area. In this state, when a part of the auxiliary wiring pattern 120 of the dummy area DA is etched, the dummy structure pattern 120a for forming the uneven boundary surface between the passivation pattern 140 and the adhesive layer 167 in the dummy area DA may be formed.

A moisture intrusion path (arrow b' of FIG. 7) illustrated in FIG. 7 may be relatively increased compared to the moisture intrusion path (arrow a of FIG. 3) in which the passivation pattern 140 and the adhesive layer 167 have a flat boundary surface in the dummy area DA. In addition, the moisture intrusion path (arrow b of FIG. 4) illustrated in FIG. 4 and the moisture intrusion path (arrow b' of FIG. 7) illustrated in FIG. 7 may be almost similar to each other. The moisture intrusion paths in FIGS. 4 and 7 may be determined according to the number and height of dummy structure patterns. For example, when the number of dummy structure patterns is increased or the height of a dummy structure pattern is increased, the moisture intrusion path between the passivation pattern 140 and the adhesive layer 167 in the dummy area DA may also be increased.

In FIGS. 4 and 7, the moisture intrusion path is increased as the passivation pattern 140 and the adhesive layer 167 in the dummy area DA have an uneven boundary surface by using the dummy structure patterns (115a of FIGS. 4 and 120a of FIG. 7).

Figure 10:
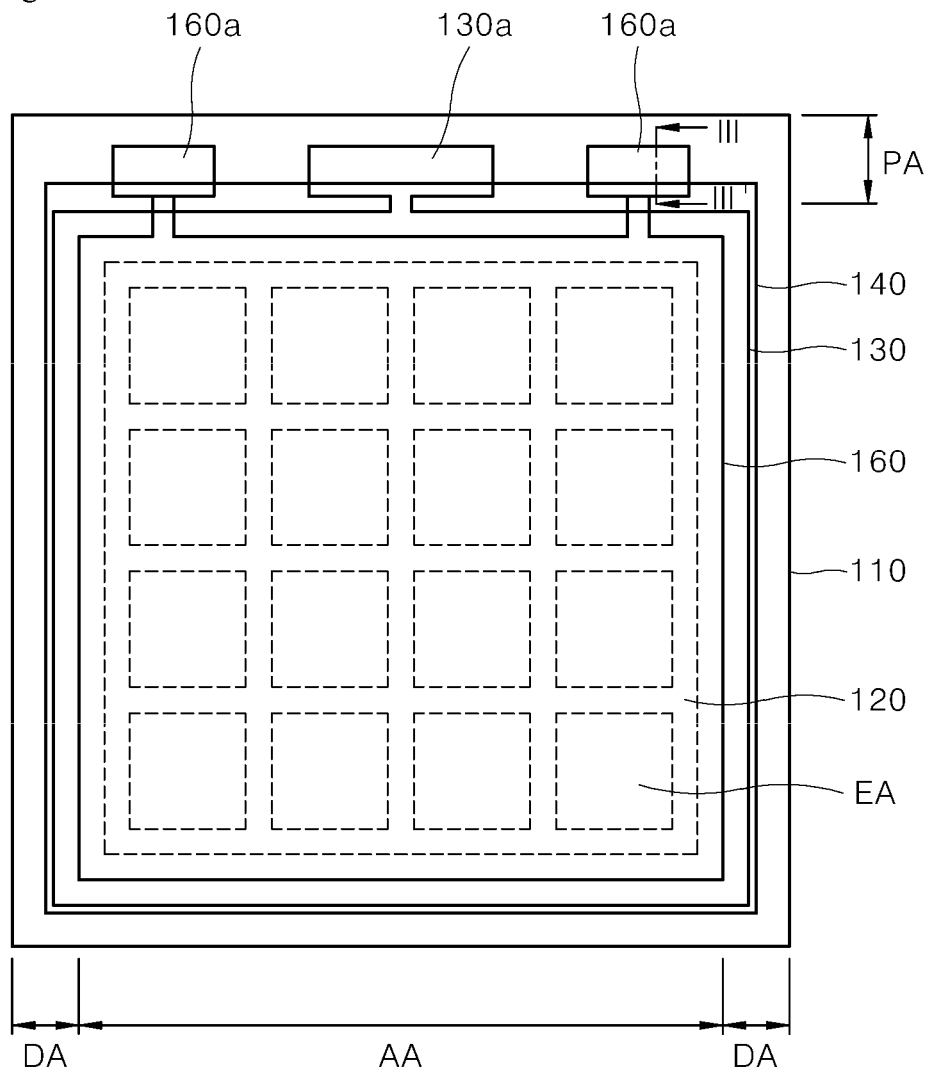
FIG. 10 is a schematic plan view of an OLED panel for a lighting device according to another embodiment of the present disclosure.
Figure 11:
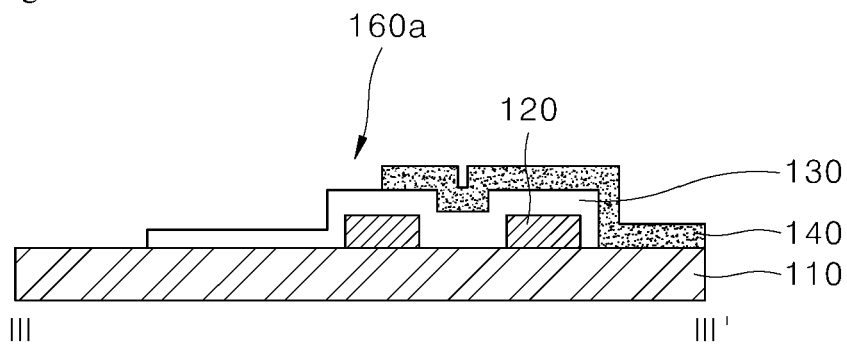
FIG. 11 is a cross-sectional view taken along line III-III' of FIG. 10.

FIG. 10 is a schematic plan view of an OLED panel for a lighting device according to an embodiment of the present disclosure. FIG. 11 is a cross-sectional view taken along line III-III' of FIG. 10.

Alternatively, as shown in FIGS. 10 and 11 another embodiment of the present application may increase another possible moisture intrusion path between the passivation pattern 140 and a pad (such as the pad 160a) in the pad area PA that have an uneven boundary surface therebetween by using similar dummy structure patterns.

More particularly, in this embodiment, an organic light-emitting diode panel for a lighting device is provided, wherein the organic light-emitting diode panel includes an array area having an emission area and a pad area disposed near the array area and comprises: a substrate; an auxiliary wiring pattern disposed on the substrate; a first electrode disposed on the substrate where the auxiliary wiring pattern is disposed; a passivation pattern disposed on the substrate where the first electrode is disposed; an organic light-emitting diode emission structure disposed on the substrate where the passivation pattern is disposed in the array area; a second electrode disposed on the substrate where the organic light-emitting diode emission structure is disposed; and a pad including the same material as the auxiliary wiring pattern that is disposed on the substrate in the pad area and contacts the passivation pattern; wherein the passivation pattern and the pad have an uneven boundary surface therebetween.

Optionally, one or more dummy structure patterns are disposed in the pad, and the passivation pattern in the pad area has a surface in an uneven structure corresponding to a surface of the pad where the dummy structure pattern is disposed.

For example, the dummy structure pattern may comprise a light extraction material. Preferably, a light extraction pattern made of the light extraction material is disposed under the auxiliary wiring pattern.

Alternatively, the dummy structure pattern may comprise the same material as the auxiliary wiring pattern.

Optionally, a capping layer is further disposed on the second electrode.

Optionally, the auxiliary wiring pattern is formed of a material having resistance lower than that of the material of the first electrode.

Optionally, the passivation pattern is formed at least in a part of the pad area and an area where the auxiliary wiring pattern is disposed.

Optionally, the organic light-emitting diode panel may further comprise an encapsulation layer disposed on the adhesive layer.

Optionally, the pad includes a first layer made of the same material as the auxiliary wiring pattern and an optional second layer disposed on the first layer and made of the same material as the first electrode.

Figure 8:
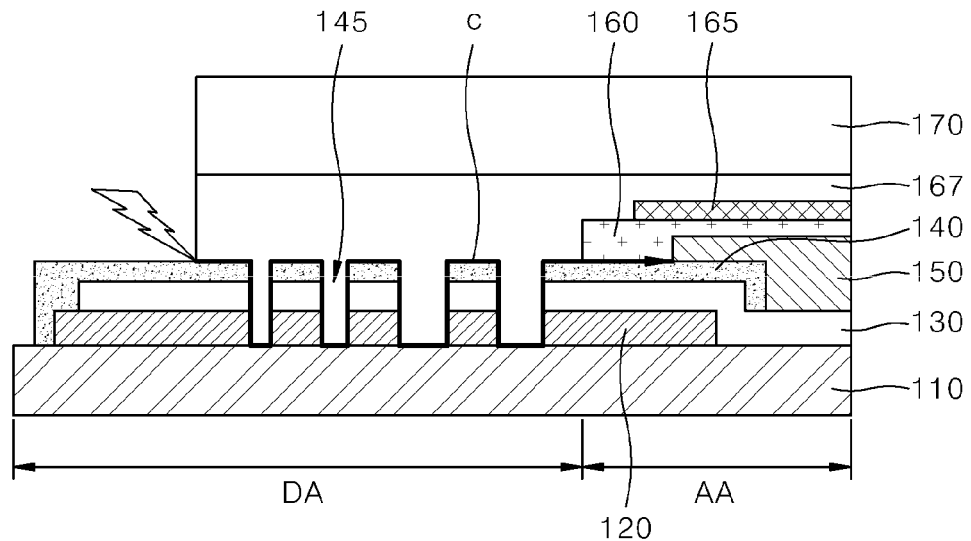
FIG. 8 is another example of a cross-sectional view taken along line II-II' of FIG. 1.

FIG. 8 is another example of a cross-sectional view taken along line II-II' of FIG. 1.

As discussed above, in FIGS. 4 and 7, the moisture intrusion path is increased as the passivation pattern 140 and the adhesive layer 167 in the dummy area DA have an uneven boundary surface by using the dummy structure patterns (115a of FIGS. 4 and 120a of FIG. 7).

In contrast, in an example illustrated in FIG. 8, a groove 145 penetrating through the passivation pattern 140 may be provided at least in the dummy area DA, and the adhesive layer 167 is disposed not only above the passivation pattern 140, but also in the groove 145. A lower surface of the adhesive layer 167 may have a 3D structure in the dummy area DA due to the groove 145. In such a structure, the moisture intrusion path may be increased like a moisture intrusion path (arrow c) illustrated in the FIG. 8. Furthermore, the groove 145 and the passivation pattern 140 remaining between the grooves 145 may act as barriers to the moisture intrusion.

The groove 145 may additionally penetrate through the first electrode 130 disposed under the passivation pattern 140 in the dummy area DA of the substrate 110. As illustrated in FIG. 8, the groove 145 may additionally penetrate through the first electrode 130 and the auxiliary wiring pattern 120 disposed in the dummy area DA of the substrate 110. The groove 145 that penetrates through not only the passivation pattern 140, but also the first electrode 130 and the auxiliary wiring pattern 120, may have a depth deeper than the groove that penetrates through only the passivation pattern 140, thereby further increasing the moisture intrusion path.

The groove 145 illustrated in FIG. 8 may be formed by sequentially arranging the auxiliary wiring pattern 120, the first electrode 130, and the passivation pattern 140 in the dummy area DA of the substrate 110, and then collectively etching the same.

Figure 9:
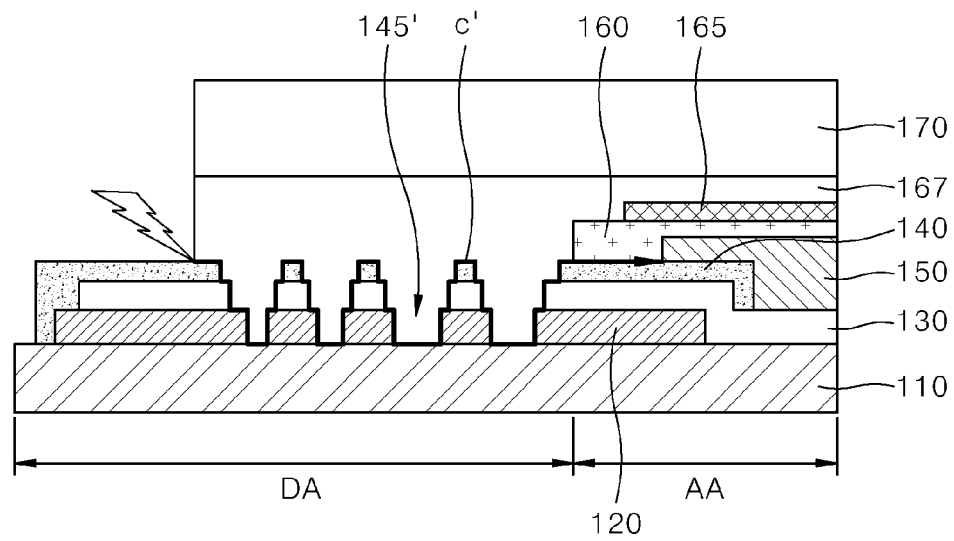
FIG. 9 is another example of a cross-sectional view taken along line II-II' of FIG. 1.

FIG. 9 is another example of a cross-sectional view taken along line II-II' of FIG. 1.

In an example illustrated in FIG. 9, like the example of FIG. 8, the lower surface of the adhesive layer 167 has a 3D structure by a groove 145'.

However, while side walls of the groove 145 of FIG. 8 have a continuous shape, side walls of the groove 145' of FIG. 9 have a step shape. In the case of the groove 145' of FIG. 9, after sequentially arranging the auxiliary wiring pattern 120, the first electrode 130, and the passivation pattern 140 in the dummy area DA of the substrate 110, the passivation pattern 140 is first etched, the first electrode 130 thereunder is subsequently etched, and then the auxiliary wiring pattern 120 is etched.

A moisture intrusion path (arrow c') of FIG. 9 seems to be increased longer than the moisture intrusion path (arrow c) of FIG. 8, and thus higher moisture intrusion delay effect may be obtained.

As described above, in the OLED panel for a lighting device according to the present disclosure, as illustrated in FIGS. 4 and 7, the dummy structure pattern (115a of FIGS. 4 and 120a of FIG. 7) is formed in the dummy area DA of the substrate, and thus the passivation pattern and the adhesive layer have an uneven boundary surface in the dummy area DA, or as illustrated in FIGS. 8 and 9, the groove (145 of FIG. 8 and 145' of FIG. 9) is formed in the dummy area DA of the substrate, and thus the lower surface of the adhesive layer has a 3D structure. Accordingly, the moisture intrusion path may be increased, and consequently the life characteristics of the OLED panel for a lighting device may be improved due to the moisture intrusion delay.

As described above, according to the present disclosure, the OLED panel for a lighting device according to the present disclosure may be easily manufactured to be large and surface emission may be possible. Thus, an expensive sapphire substrate for forming a nitride semiconductor light-emitting diode is not needed, and heat is not much generated compared to the nitride semiconductor light-emitting diode.

In particular, in the OLED panel for a lighting device according to the present disclosure, since the passivation pattern and the adhesive layer are provided to have an uneven boundary surface therebetween in the dummy area, or the lower surface of the adhesive layer for bonding the encapsulation layer is provided in a 3D structure, the moisture intrusion path may be increased, and a barrier to the moisture intrusion can be provided. Accordingly, the OLED panel for a lighting device according to the present disclosure may prevent degradation of an OLED emission structure due to the external moisture intrusion, and may improve life characteristics.

The present disclosure described above may be variously substituted, altered, and modified by those skilled in the art to which the present inventive concept pertains without departing from the scope and sprit of the present disclosure. Therefore, the present disclosure is not limited to the above-mentioned exemplary embodiments and the accompanying drawings.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting diode panel for a lighting device, comprising:
 a substrate including an array area and a dummy area disposed outside the array area;
 an auxiliary wiring pattern disposed on the substrate, the auxiliary wiring pattern having a net shape;
 a first electrode disposed on the substrate and the auxiliary wiring pattern;
 a passivation pattern surrounding the auxiliary wiring pattern and the first electrode in the dummy area;

an organic light-emitting diode emission structure disposed on the first electrode and the passivation pattern in the array area; and second electrode disposed on the organic light-emitting diode emission structure; and an adhesive layer disposed on the second electrode and contacting the passivation pattern in the dummy area, the passivation pattern and the adhesive layer having an uneven boundary surface between the passivation pattern and the adhesive layer in the dummy area, wherein in the array area of the substrate, the passivation pattern is disposed between the first electrode and the organic light-emitting diode emission structure on the auxiliary wiring pattern, wherein one or more dummy structure patterns are disposed in the dummy area of the substrate, wherein a surface of the passivation pattern in the dummy area has an uneven structure corresponding to a surface of the substrate having an uneven structure where the dummy structure pattern is disposed, wherein the dummy structure pattern comprises a light extraction material, and wherein the light extraction material includes light scattering particles.

2. The organic light-emitting diode panel for the lighting device of claim 1, wherein in the array area of the substrate, a light extraction pattern made of the light extraction material is disposed under the auxiliary wiring pattern.

3. The organic light-emitting diode panel for the lighting device of claim 1, wherein a capping layer is further disposed on the second electrode.

4. The organic light-emitting diode panel for the lighting device of claim 1, wherein the auxiliary wiring pattern is a material having a resistance that is lower than a resistance of a material of the first electrode.

5. The organic light-emitting diode panel for the lighting device of claim 1, wherein the passivation pattern is at least in an area where the auxiliary wiring pattern is disposed.

6. The organic light-emitting diode panel for the lighting device of claim 1, further comprising an encapsulation layer disposed on the adhesive layer.

7. An organic light-emitting diode panel for a lighting device, comprising:

a substrate including an array area having an emission area, and including a dummy area disposed outside the array area;

an auxiliary wiring pattern disposed on the substrate;

a first electrode disposed on the substrate and the auxiliary wiring pattern;

a passivation pattern surrounding the auxiliary wiring pattern and the first electrode in the dummy area;

an organic light-emitting diode emission structure disposed on the first electrode and the passivation pattern in the array area; and second electrode disposed on the organic light-emitting diode emission structure; and an adhesive layer disposed on the second electrode and contacting the passivation pattern in the dummy area, a lower surface of the adhesive layer having a three-dimensional structure in the dummy area, wherein in the array area of the substrate, the passivation pattern is disposed between the first electrode and the organic light-emitting diode emission structure on the auxiliary wiring pattern, wherein one or more dummy structure patterns are disposed in the dummy area of the substrate, wherein a surface of the passivation pattern in the dummy area has an uneven structure corresponding to a surface of the substrate having an uneven structure where the dummy structure pattern is disposed, wherein the dummy structure pattern comprises a light extraction material, and wherein the light extraction material includes light scattering particles.

8. The organic light-emitting diode panel for the lighting device of claim 7, wherein a capping layer is on the second electrode.

9. The organic light-emitting diode panel for the lighting device of claim 7, wherein the auxiliary wiring pattern is a material having resistance lower than a resistance of a material of the first electrode.

10. The organic light-emitting diode panel for the lighting device of claim 7, further comprising an encapsulation layer disposed on the adhesive layer.

* * * * *